United States Patent
Su et al.

(10) Patent No.: US 8,406,005 B2
(45) Date of Patent: Mar. 26, 2013

(54) PRINTED CIRCUIT BOARD

(75) Inventors: Hsiao-Yun Su, Tu-Cheng (TW);
Yung-Chieh Chen, Tu-Cheng (TW);
Cheng-Hsien Lee, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 128 days.

(21) Appl. No.: 13/050,954

(22) Filed: Mar. 18, 2011

(65) Prior Publication Data
US 2012/0229997 A1  Sep. 13, 2012

(30) Foreign Application Priority Data
Mar. 7, 2011  (TW) ................................. 100107481

(51) Int. Cl.
*H05K 7/10* (2006.01)
*H05K 7/12* (2006.01)
(52) U.S. Cl. ........ 361/767; 361/803; 174/261; 174/262; 174/263; 174/264
(58) Field of Classification Search .......... 361/772–775, 361/767, 803; 333/100, 120, 125–128, 136; 174/261, 262, 263, 264
See application file for complete search history.

(56) References Cited

U.S. PATENT DOCUMENTS

| | | | |
|---|---|---|---|
| 7,208,972 B2 * | 4/2007 | Dreps et al. ..................... 326/26 |
| 8,039,748 B2 * | 10/2011 | Koga ......................... 174/110 R |
| 2003/0020459 A1 * | 1/2003 | Lambert ..................... 324/158.1 |
| 2006/0081397 A1 * | 4/2006 | Enchi et al. ..................... 174/260 |
| 2006/0272852 A1 * | 12/2006 | Carrier et al. ................. 174/261 |
| 2007/0136618 A1 * | 6/2007 | Ohsaka ......................... 713/323 |
| 2008/0060050 A1 * | 3/2008 | Briano et al. ................. 725/149 |

* cited by examiner

*Primary Examiner* — Yuriy Semenenko
*Assistant Examiner* — Andargie M Aychillhum
(74) *Attorney, Agent, or Firm* — Altis Law Group, Inc.

(57) ABSTRACT

A printed circuit board includes first and second transmission lines connected to a first high speed differential signal control chip, third and fourth transmission lines connected to a second high speed differential signal control chip, and fifth and sixth transmission lines connected to a connector pad. To have the first high speed differential signal control chip communicate with the connector pad, the first transmission line is connected to the fifth transmission line through a first connection component, and the second transmission line is connected to the sixth transmission line through a second connection component. To have the second speed differential signal control chip communicate with the connector pad, the third transmission line is connected to the fifth transmission line through the first connection component, and the fourth transmission line is connected to the sixth transmission line through the second connection component.

2 Claims, 5 Drawing Sheets

PRINTED CIRCUIT BOARD

CROSS-REFERENCE OF RELATED ART

Relevant subject matter is disclosed in a co-pending U.S. patent application with application Ser. No. 12/978,527, filed on Dec. 24, 2010, a co-pending U.S. patent application with application Ser. No. 12/633,655, filed on Dec. 8, 2009, and a co-pending U.S. patent application with application Ser. No. 12/633,653, filed on Dec. 8, 2009, with the same title "PRINTED CIRCUIT BOARD", which are assigned to the same assignee as this patent application.

BACKGROUND

1. Technical Field

The present disclosure relates to a printed circuit board.

2. Description of Related Art

A typical personal computer includes a motherboard, memory modules, a number of connectors, and peripheral accessories. The connectors on the motherboard vary according to users' requirements. For example, a peripheral component interconnect express (PCI-E) control chip can support a solid state drive (SSD) with a PCI-E interface, or an expansion card with a PCI-E interface. However, a type of PCI-E control chips can support only one type of PCI-E connectors at a time. If the PCI-E connectors do not match the PCI-E control chips, the layout of the motherboard must be changed accordingly. Therefore, the cost for producing motherboards with different configurations will be increased.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by limitation. It should be noted that references to "an" or "one" embodiment in this disclosure are not necessarily to the same embodiment, and such references mean at least one.

Figure 1:
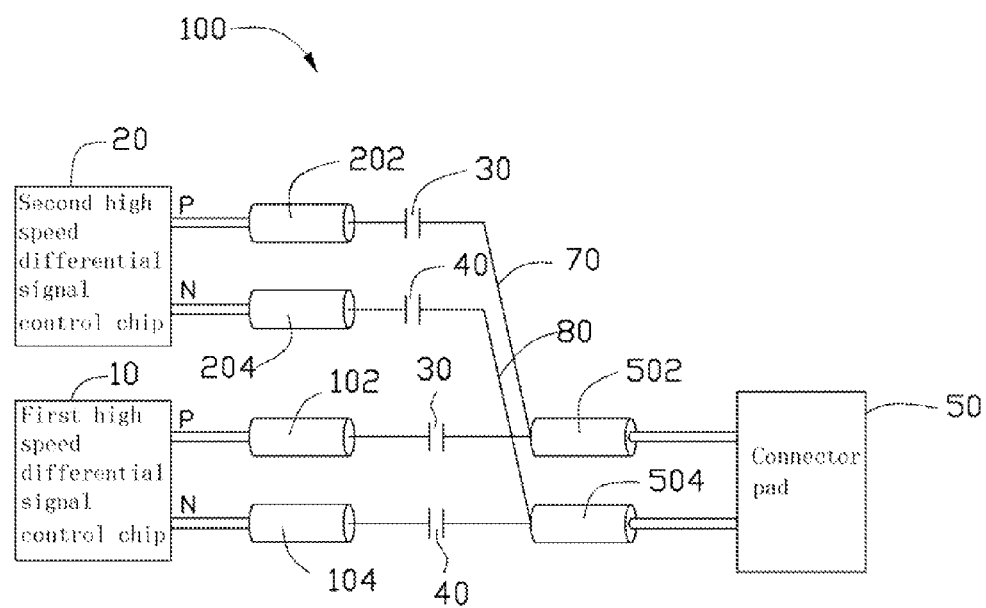
FIG. 1 is a schematic diagram of an exemplary embodiment of a printed circuit board (PCB), the PCB includes first and second high speed differential signal control chips and a connector pad.
Figure 5:
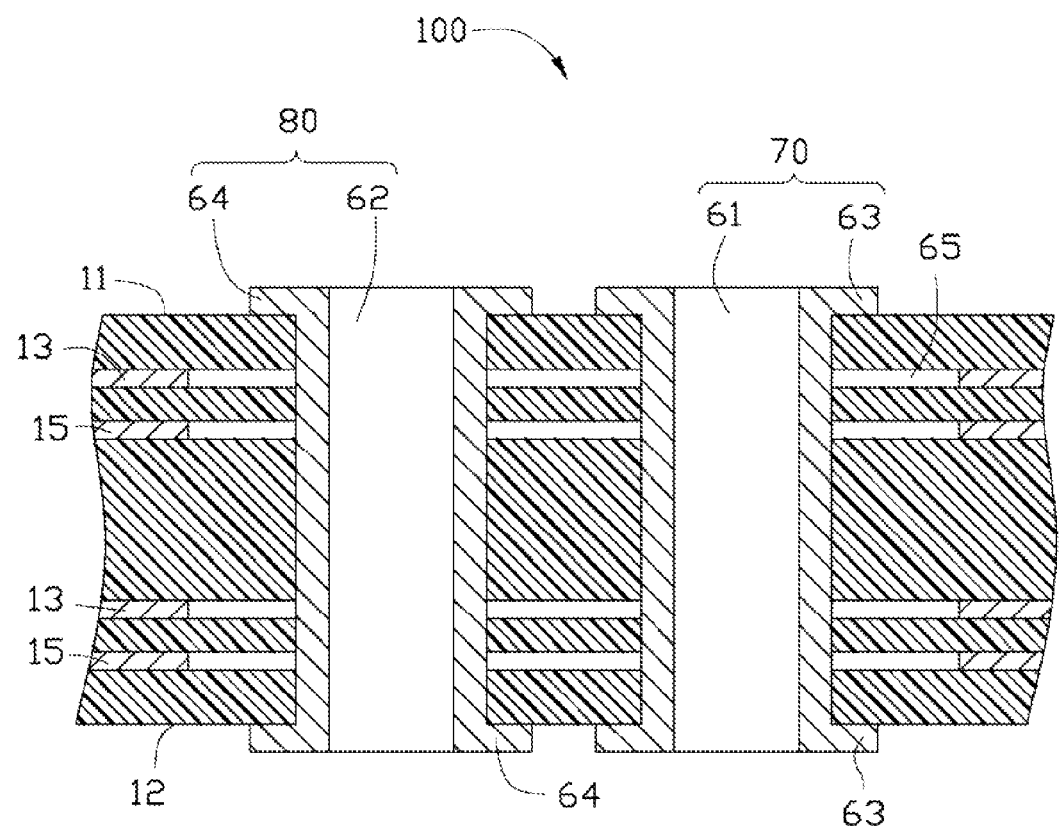
FIG. 5 is a sectional view of the PCB of FIG. 4, taken along line V-V and showing multiple layers of the PCB.

Referring to FIG. 1 and FIG. 5, a printed circuit board (PCB) 100 in accordance with an exemplary embodiment includes a top layer 11, a bottom layer 12, a plurality of power layers 13, a plurality of ground layers 15, a first high speed differential signal control chip 10 set on the top layer 11, a second high speed differential signal control chip 20 set on the bottom layer 12, two connection components 30 and 40, a connector pad 50 set on the top layer 11, and transmission lines 102, 104, 202, 204, 502, and 504.

The first and the second high speed differential signal control chips 10 and 20 each include two output terminals P and N. The first and the second high speed differential signal control chips 10 and 20 are different types of high speed differential signal control chips, for outputting different types of high speed differential signals. The transmission lines 102 and 104 are located on the top layer 11. A first end of the transmission line 102 is connected to the output terminal P of the first high speed differential signal control chip 10, and a first end of the transmission line 104 is connected to the output terminal N of the first high speed differential signal control chip 10. The transmission lines 202 and 204 are located on the bottom layer 12. A first end of the transmission line 202 is connected to the output terminal P of the second high speed differential signal control chip 20, and a first end of the transmission line 204 is connected to the output terminal N of the second high speed differential signal control chip 20. The transmission lines 502 and 504 are located on the top layer 11. Two vertical interconnect accesses (vias) 70 and 80 are defined in the PCB 100, through the top layer 11 to the bottom layer 12. The transmission line 502 is connected between a first input terminal of the connector pad 50 and the via 70. The transmission line 504 is connected between a second input terminal of the connector pad 50 and the via 80. In other embodiments, the first and the second high speed differential signal control chips 10 and 20, the connector pads 50, and the transmission lines 102, 104, 202, 204, 502, and 504 can be set at other locations on the PCB 100 as needed. In one embodiment, the connection components 30 and 40 are coupled capacitors.

Figure 2:
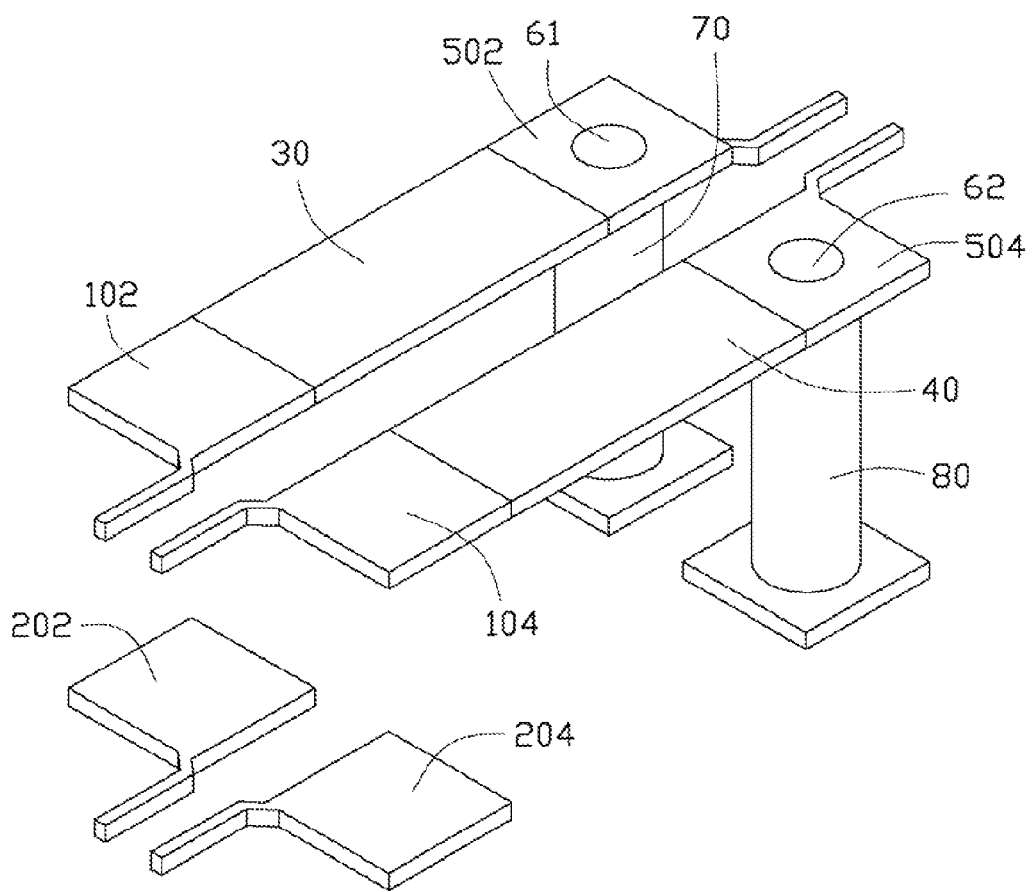
FIG. 2 is a schematic diagram showing that the first high speed differential signal control chip is connected to the connector pad of FIG. 1.

Referring to FIG. 2, to have the first high speed differential signal control chip 10 communicate with the connector pad 50, the connection component 30 is attached to the top layer 10 and connected (e.g., by welding) between the transmission line 102 and the transmission line 502, thereby the transmission line 102 communicates with the transmission line 502 through the connection component 30. The connection component 40 is attached to the top layer 10 and connected between the transmission line 104 and the transmission line 504, thereby the transmission line 104 communicates with the transmission line 504 through the connection component 40. The second high speed differential signal control chip 20 is idle. The high speed differential signal control chip 10 sends high speed differential signals from the output terminals P and N to the connector pad 50 through the transmission lines 102 and 104, the connection components 30 and 40, and the transmission lines 502 and 504, respectively.

Figure 3:
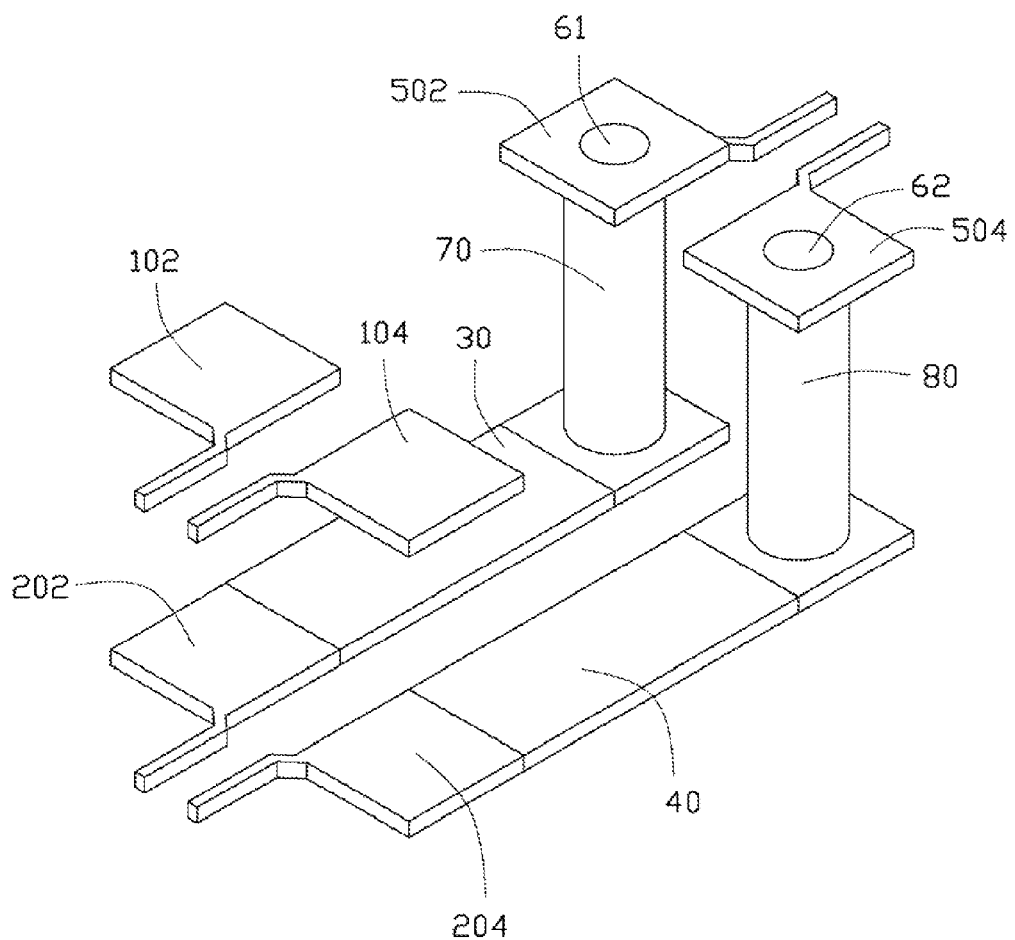
FIG. 3 is a schematic diagram showing that the second high speed differential signal control chip is connected to the connector pad of FIG. 1.

Referring to FIG. 3, to have the second high speed differential signal control chip 20 communicate with the connector pad 50, the connection component 30 is attached to the bottom layer 12 and connected between the transmission line 202 and the via 70, thereby the transmission line 202 communicates with the transmission line 502 through the connection component 30 and the via 70. The connection component 40 is attached to the bottom layer 12 and connected between the transmission line 204 and the via 80, thereby the transmission line 204 communicates with the transmission line 504 through the connection component 40 and the via 80. The first high speed differential signal control chip 10 is idle. The second high speed differential signal control chip 20 sends high speed differential signals from the output terminals P and N to the connector pad 50 through the transmission lines 202 and 204, the connection components 30 and 40, the vias 70 and 80, and the transmission lines 502 and 504, respectively.

Figure 4:
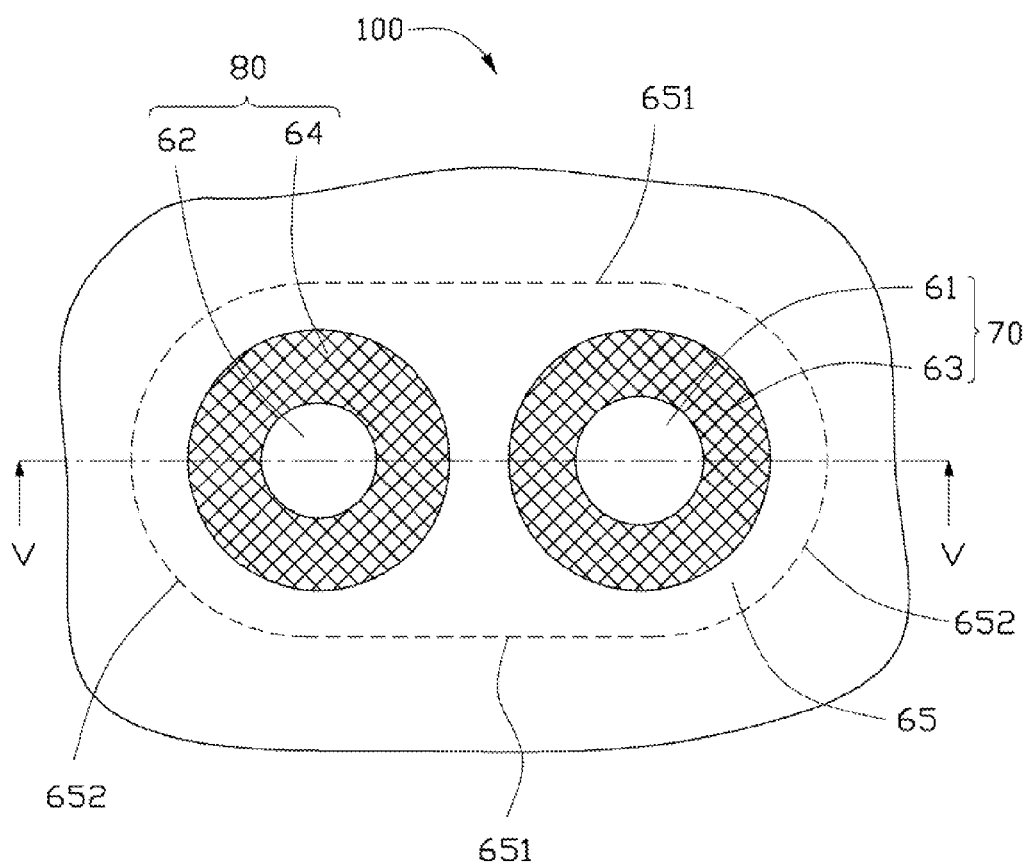
FIG. 4 is a schematic, top plan view of the PCB of FIG. 1.

Referring to FIG. 4, each of the power layers 13 and the ground layer 15 respectively define a clearance hole 65 through which the vias 70 and 80 extend. In one embodiment, the clearance holes 65 are substantially oval-shaped and have two opposite straight edges 651 parallel to an imaginary line connecting the central axes of the vias 70 and 80, and two arc-shaped edges 652 each connected between corresponding ends of the straight edges 651. A distance between the straight edges 651 is greater than an outer diameter of each of the vias 70 and 80, and the arc-shaped edges 652 are spaced from the vias 70 and 80, such that the vias 70 and 80 are arranged within the clearance hole 65. In one embodiment, the vias 70 and 80 are located symmetrically with respect to a center axis of the clearance hole 65.

The PCB 100 can support different types of peripheral devices by selectively setting the connection components 30 and 40 on the PCB 100 without changing the wiring of the transmission lines 102, 104, 202, 204, 502, and 504 or making new vias in the PCB 100. The connection components 30 and 40 function as switches and/or filters. Furthermore, each of the power layers 13 and the ground layer 15 defines a clearance hole 65, to minimize the reflection of the signals between the transmission lines and the vias 70 and 80. Hence, the degradation of the signals at the pair of vias 70 and 80 can be efficiently decreased.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A printed circuit board (PCB) comprising:
   a first high speed differential signal control chip to output a first high speed differential signal;
   a second high speed differential signal control chip to output a second high speed differential signal, wherein the second high speed differential signal is different from the first high speed differential signal;
   a first and a second connection components;
   a connector pad; and
   a first to a sixth transmission lines, wherein the first and second transmission lines are connected to two output terminals of the first high speed differential signal control chip, the third and fourth transmission lines are connected to two output terminals of the second high speed differential signal control chip, the fifth and sixth transmission lines are connected to first and second input terminals of the connector pad;
   wherein, to have the first high speed differential signal control chip communicate with the connector pad, the first transmission line is connected to the fifth transmission line through the first connection component, and the second transmission line is connected to the sixth transmission line through the second connection component; and
   wherein, to have the second high speed differential signal control chip communicate with the connector pad, the third transmission line is connected to the fifth transmission line through the first connection component, and the fourth transmission line is connected to the sixth transmission line through the second connection component,
   wherein the first high speed differential signal control chip, the first and second transmission lines, the fifth and sixth transmission lines, and the connector pad are located on a top layer of the PCB; the second high speed differential signal control chip and the third and fourth transmission lines are located on a bottom layer of the PCB,
   wherein first and second vertical interconnect accesses (vias) are defined in the PCB, through the top layer to the bottom layer, the fifth transmission line is connected between the first via and the connector pad, and the sixth transmission line is connected between the second vias and the connector pad,
   wherein a plurality of power layers and a plurality of ground layers, wherein each of the power layers and the ground layers defines a clearance hole through which the first and second vias extend,
   wherein the clearance hole is substantially oval-shaped, and bounded by two straight parallel edges and two arc-shaped edges connected between corresponding ends of the two straight parallel edges, and
   wherein the two straight parallel edges are parallel to an imaginary line connected between central axes of the first and second vias, and a distance between the two straight edges is greater than an outer diameter of each of the first and second vias, the two arc-shaped edges are spaced from the first and second vias and located symmetrically with respect to a center axis of the clearance hole.

2. The PCB of claim 1, wherein the first and second connection components are coupled capacitors.

* * * * *